(12) United States Patent
Fujiwara et al.

(10) Patent No.: US 10,388,904 B2
(45) Date of Patent: Aug. 20, 2019

(54) ORGANIC EL DISPLAY DEVICE AND METHOD FOR PRODUCING ORGANIC EL DISPLAY DEVICE

(71) Applicant: Sharp Kabushiki Kaisha, Sakai, Osaka (JP)

(72) Inventors: Seiji Fujiwara, Sakai (JP); Takeshi Hirase, Sakai (JP); Tetsuya Okamoto, Sakai (JP); Tohru Senoo, Sakai (JP); Tohru Sonoda, Sakai (JP); Daichi Nishikawa, Sakai (JP); Mamoru Ishida, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 11 days.

(21) Appl. No.: 15/524,381

(22) PCT Filed: Nov. 4, 2015

(86) PCT No.: PCT/JP2015/080989
§ 371 (c)(1),
(2) Date: May 4, 2017

(87) PCT Pub. No.: WO2016/072406
PCT Pub. Date: May 12, 2016

(65) Prior Publication Data
US 2018/0287091 A1    Oct. 4, 2018

(30) Foreign Application Priority Data
Nov. 7, 2014   (JP) ................ 2014-227288

(51) Int. Cl.
*H01L 51/52* (2006.01)
*H01L 27/32* (2006.01)
(Continued)

(52) U.S. Cl.
CPC ...... *H01L 51/5218* (2013.01); *H01L 27/3262* (2013.01); *H01L 51/0097* (2013.01);
(Continued)

(58) Field of Classification Search
None
See application file for complete search history.

(56) References Cited

U.S. PATENT DOCUMENTS

2006/0158101 A1* 7/2006 Camilletti ........... H01L 51/0097
                                                          313/504
2010/0019664 A1* 1/2010 Mishima ............. H01L 51/5268
                                                          313/504
(Continued)

FOREIGN PATENT DOCUMENTS

JP   2006-059599 A   3/2006
JP   2008-153243 A   7/2008
(Continued)

OTHER PUBLICATIONS

Joled, English translation of JP2015-102069, pp. 1-18 (Year: 2015).*

*Primary Examiner* — Shaun M Campbell
(74) *Attorney, Agent, or Firm* — ScienBiziP, P.C.

(57) ABSTRACT

Provided is an organic EL display device that includes: a substrate; a first electrode provided on the substrate; an organic EL layer provided on the first electrode; a second electrode provided on the organic EL layer; and a sealing film layer provided so as to cover the second electrode. The sealing film layer has protruding portions and recessed portions.

6 Claims, 4 Drawing Sheets

(51) Int. Cl.
  *H01L 51/00* (2006.01)
  *H01L 51/50* (2006.01)
  *H01L 51/56* (2006.01)

(52) U.S. Cl.
  CPC ...... *H01L 51/5036* (2013.01); *H01L 51/5056* (2013.01); *H01L 51/5072* (2013.01); *H01L 51/5092* (2013.01); *H01L 51/5234* (2013.01); *H01L 51/5246* (2013.01); *H01L 51/5253* (2013.01); *H01L 51/56* (2013.01); *H01L 2251/5338* (2013.01)

(56) References Cited

U.S. PATENT DOCUMENTS

| | | | |
|---|---|---|---|
| 2015/0255522 A1* | 9/2015 | Sato | H01L 27/3244 257/88 |
| 2016/0020226 A1* | 1/2016 | Cheng | H01L 27/1218 257/72 |

FOREIGN PATENT DOCUMENTS

| | | | | |
|---|---|---|---|---|
| JP | 2010-027429 A | | 2/2010 | |
| JP | 2015-102069 | * | 5/2015 | ............. H05B 33/04 |

* cited by examiner

ORGANIC EL DISPLAY DEVICE AND METHOD FOR PRODUCING ORGANIC EL DISPLAY DEVICE

TECHNICAL FIELD

The present invention relates to an organic electro-luminescence (EL) display device and a method for producing the organic EL display device.

BACKGROUND ART

An organic electro-luminescence (EL) display device is known in which a sealing film layer is provided over organic EL elements in order to prevent the deterioration of the organic EL elements caused by moisture intruding from outside. In a configuration in which organic EL elements are arranged on a flexible substrate, and a sealing film layer is provided over the organic EL elements, when the flexible substrate is bent, cracks are possibly generated in the sealing film layer due to film stress, and moisture and the like possibly intrudes through the cracks, which deteriorates the organic EL elements.

Patent Document 1 discloses a technique used for an organic EL display device in which a first electrode layer, an organic EL layer, and a second electrode layer are laminated on a flexible substrate, which is a technique of forming a side surface of the first electrode layer in a tapered shape, so as to reduce the stress concentration on each layer end.

PRIOR ART DOCUMENT

Patent Document

Patent Document 1: JP-A-2014-13775

SUMMARY OF THE INVENTION

Problem to be Solved by the Invention

In the case of the organic EL display device disclosed in Patent Document 1, however, only stress applied to the end of each layer is taken into consideration, and regarding a configuration in a case where a sealing film layer is provided over organic EL elements, stress applied to the sealing film layer is not taken into consideration.

It is an object of the present invention to provide a technique used for an organic EL display device provided with a sealing film layer, which is a technique for reducing stress applied on the sealing film layer when it is bent.

Means to Solve the Problem

An organic EL display device in one embodiment of the present invention includes: a substrate; a first electrode provided on the substrate; an organic EL layer provided on the first electrode; a second electrode provided on the organic EL layer; and a sealing film layer provided so as to cover the second electrode. The sealing film layer has protruding portions and recessed portions.

Effect of the Invention

According to the present disclosure, the stress applied on the sealing film layer when it is bent can be reduced.

MODE FOR CARRYING OUT THE INVENTION

An organic EL display device in one embodiment of the present invention includes: a substrate; a first electrode provided on the substrate; an organic EL layer provided on the first electrode; a second electrode provided on the organic EL layer; and a sealing film layer provided so as to cover the second electrode. The sealing film layer has protruding portions and recessed portions.

With the above-described configuration, even in a case where the organic EL display device is bent, the configuration of the sealing film layer having the protrusions and recesses reduces stress occurring upon the bending. This prevents cracks from being generated in the sealing film layer, thereby preventing moisture and the like from intruding into the organic EL layer.

The protruding portions of the sealing film layer may be formed in a lattice pattern. With this configuration, when the sealing film layer is bent in any direction of the vertical, horizontal, and diagonal directions, stress occurring upon the bending is reduced. This prevents cracks from being generated in the sealing film layer when the organic EL display device is bent in any direction, thereby suppressing deterioration caused by moisture and the like intruding into the organic EL layer.

The sealing film layer is formed in such a shape that a plurality of protruding portions extending in one direction and a plurality of recessed portions extending in one direction are arrayed alternately. With this configuration, when the sealing film layer is bent particularly along the direction in which the protruding portions and the recessed portions extend, stress occurring upon the bending is reduced, whereby cracks are prevented from being generated in the sealing film layer.

A method for producing an organic EL display device includes the steps of: forming a first electrode on a substrate; forming an organic EL layer on the first electrode; forming a second electrode on the organic EL layer; and forming a sealing film layer having protruding portions and recessed portions so that the sealing film layer covers the second electrode. In the step of forming the sealing film layer having protruding portions and recessed portions, a sealing film layer having a single layer structure is formed by using a mask that has full-open apertures that completely pass through the mask, and half-open apertures at which thickness of the mask is decreased. With this, a sealing film layer in which stress occurring upon bending is reduced can be formed through one film forming process.

A method for producing an organic EL display device includes the steps of: forming a first electrode on a substrate; forming an organic EL layer on the first electrode; forming a second electrode on the organic EL layer; and forming a sealing film layer having protruding portions and recessed portions so that the sealing film layer covers the second electrode. In the step of forming the sealing film layer having protruding portions and recessed portions, a sealing film layer having a laminate structure is formed through a sub-step of forming a sealing film layer in a part of an area of the second electrode, and a sub-step of forming a sealing film layer in an entirety of the area of the second electrode. With this, a sealing film layer can be formed by using masks simpler than the mask used when the sealing film layer is formed through one film forming process, for example, a mask having only full-open apertures as the openings, and a mask having an opening corresponding to an entirety of the film forming area.

EMBODIMENT

The following describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, the dimension ratios of the constituent members illustrated in the drawings do not necessarily indicate the real dimension ratios.

Embodiment 1

Figure 1:
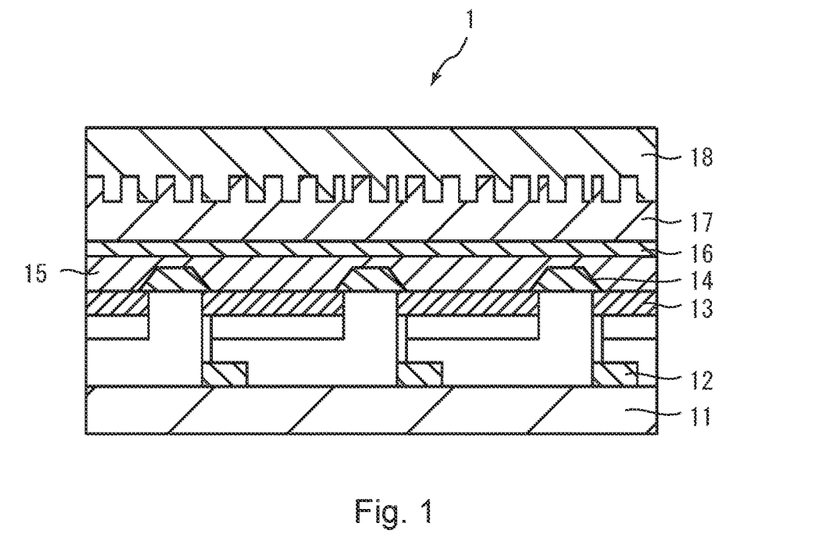
FIG. 1 is a cross-sectional view schematically illustrating a configuration of an organic EL display device in Embodiment 1.

(Configuration of Organic EL Display Device)
FIG. 1 is a cross-sectional view schematically illustrating a configuration of an organic EL display device 1 in the present embodiment.

On a TFT substrate 11, thin film transistors (TFTs) 12, signal lines (not shown), and first electrodes 13 are formed. The TFT substrate 11, which is a flexible substrate, is in a sheet form, has flexibility, and is formed with, for example, plastic or polyimide resin.

A plurality of the first electrodes 13 are formed at predetermined intervals in matrix, and the first electrodes 13 form pixel regions in the organic EL display device 1, respectively.

An organic EL layer 15 is formed on the first electrodes 13, and a second electrodes 16 is formed on the organic EL layer 15. Organic EL elements are formed with the first electrodes 13, the organic EL layer 15, and the second electrode 16.

The TFTs 12 function as switching elements that control respective light emission of the organic EL elements of red (R), green (G), and blue (B).

An edge cover 14 is formed so as to cover ends of the first electrodes 13. The edge cover 14 is an insulating layer for preventing the first electrodes 13 and the second electrode 16 from becoming short-circuited in a case where the organic EL layer 15 is thinner or the electric field concentration occurs at the ends of the first electrodes 13. Openings of the edge cover 14, that is, portions at which the first electrodes 13 are exposed, are light emission areas of the organic EL elements that form pixels, respectively.

Either the first electrode 13 or the second electrode 16 is an anode, and the other is a cathode. In a case where the first electrodes 13 are anodes and the second electrode 16 is a cathode, the first electrodes 13 are a layer for injecting (supplying) holes into the organic EL layer 15, and the second electrode 16 is a layer for injecting electrons into the organic EL layer 15. In this case, the organic EL layer 15 includes a hole injection layer, a hole transport layer, a light emission layer, an electron transport layer, and an electron injection layer, in the stated order from the first electrode 13 side.

The hole injection layer is a layer that has a function of improving the efficiency of hole injection to the organic EL layer 15.

The hole transport layer is a layer that has a function of improving the efficiency of hole transport to the light emission layer.

The light emission layer is a layer that has a function of recombining holes injected from the first electrode 13 side and electrons injected from the second electrode 16 side so as to emit light, and the layer emits any of red color light, green color light, and blue color light. The light emission layer may have such a configuration that white light is emitted by the combination of the red color light, the green color light, and the blue color light.

The electron transport layer is a layer that has a function of improving the efficiency of electron transport from the second electrode 16 to the light emission layer.

The electron injection layer is a layer that has a function of improving the efficiency of electron injection from the second electrode 16 to the organic EL layer 15.

Some of the above-described layers composing the organic EL layer 15 may be a single layer having two or more functions (for example, the hole injection layer may double as the hole transport layer). Further, the organic EL layer 15 may include another layer such as a carrier blocking layer, as required. For example, a hole blocking layer as a carrier blocking layer may be added between the light emission layer and the electron transport layer, whereby holes are prevented from going through to the electron transport layer, and the light emission efficiency can be improved.

In the above-described configuration, the first electrodes 13 are anodes, and the second electrode 16 is a cathode, but the first electrodes 13 may be cathodes, and the second electrode 16 may be an anode. in this case, the order in which the layers composing the organic EL layer 15 are laminated is reversed.

The organic EL display device 1 in the present embodiment, in which the second electrode 16 is a transparent electrode or a semi-transparent electrode, and the first electrodes 13 are reflection electrodes, has a top-emission-type configuration that emits light from the side of a flexible substrate 18 opposed to the TFT substrate 11. The organic EL display device 1, however, may have a bottom-emission-type configuration in which the first electrodes 13 are transparent electrodes or semi-transparent electrodes, the second electrode 16 is a reflection electrode, and light is emitted from the TFT substrate 11 side.

The entirety of the organic EL layer 15 and the second electrode 16 is covered with a sealing film layer 17. The sealing film layer 17 is provided for preventing the organic EL elements from deteriorating due to moisture and oxygen that intrude from outside.

The sealing film layer 17 has a single layer structure including an inorganic layer made of an inorganic material, a laminate structure including two or more inorganic layers, or a laminate structure including an organic layer and an inorganic layer. The sealing film layer 17 has a thickness of, for example, 100 nm to 10000 nm. The sealing film layer 17 is made of, for example, SiN, SiCN, SiON, or the like.

In the organic EL display device 1 in the present embodiment, the sealing film layer 17 is in a shape having protrusions and recesses on the surface (see FIG. 1). The height from the bottom of the recessed portions to the top of the protruding portions is, for example, in a range of 100 nm to 5000 nm, and it is, for example, 500 nm. The density of these protrusions and recesses is finer than the subpixel pitch, as illustrated in FIG. 1. By forming the sealing film layer 17, not in a shape having a flat surface, but in a shape having protrusions and recesses, the stress occurring upon bending is reduced. This makes it possible to prevent cracks from being generated in the sealing film layer 17, even in a case where the organic EL display device 1 is bent. The sealing film layer 17 in a shape having protrusions and recesses can be formed by using, for example, the half-exposure technique to be described below.

The flexible substrate 18 covering the sealing film layer is in a sheet form, has flexibility, and is made of, for example, plastic or polyimide resin. In other words, the organic EL display device 1 has such a structure that the TFTs 12, the first electrodes 13, the edge cover 14, the organic EL layer 15, the second electrode 16, the sealing film layer 17, and the like are interposed between the TFT substrate 11 and the flexible substrate 18.

(Method for Forming Sealing Film Layer)

To describe the method for producing the organic EL display device 1 simply, the TFTs 12 and the first electrodes 13 are formed on the TFT substrate 11, and the edge cover 14 is formed so as to cover the ends of the first electrodes 13. Further, the organic EL layer 15 is formed over the first electrodes 13, and the second electrode 16 is formed on the organic EL layer 15. Still further, the sealing film layer 17 in a shape having protrusions and recesses is formed so as to cover the second electrode 16, and the flexible substrate 18 is arranged so as to cover the sealing film layer 17. Hereinafter, the method for forming the sealing film layer 17 is described in detail.

Figure 2:
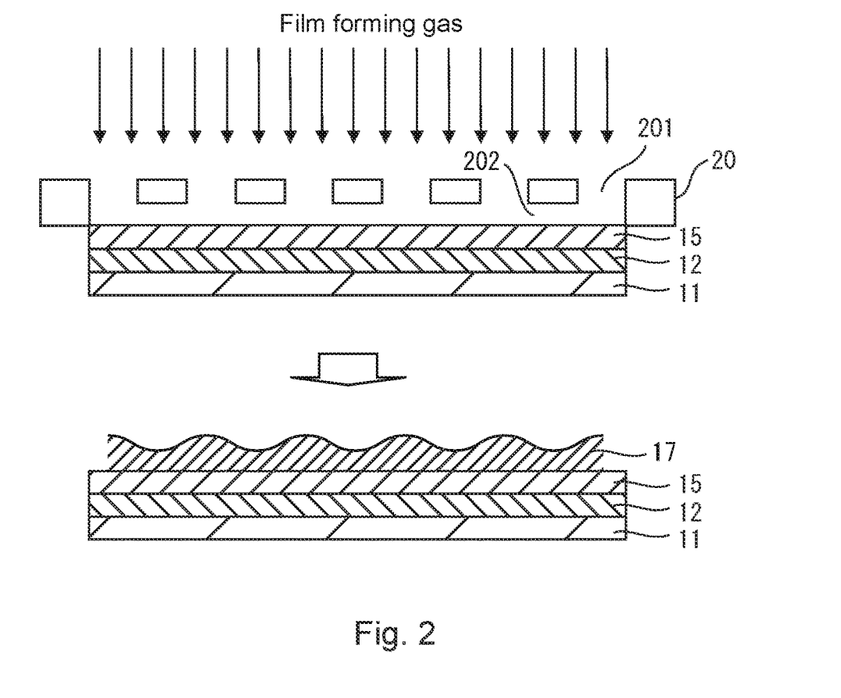
FIG. 2 is a diagram for explaining a method for forming a sealing film layer in the organic EL display device in Embodiment 1.

FIG. 2 is a diagram for explaining a method for forming the sealing film layer 17. FIG. 2 illustrates a state in which the TFTs 12, and the organic EL layer 15 are arranged on the TFT substrate 11, and further, a mask 20 to be used when the sealing film layer 17 in a shape having protrusions and recesses is formed is arranged. The first electrodes 13, the second electrode 16, and the like are actually arranged as well, but the illustration of the same is omitted in FIG. 2.

The mask 20 includes full-open apertures 201 that completely pass through the mask 20, and half-open apertures 202 at which the thickness of the mask 20 is decreased. More specifically, the full-open apertures 201 and the half-open apertures 202 are alternately formed. Adjacent ones of the full-open apertures 201 have a space therebetween of, for example, 1 mm or more. As illustrated in FIG. 2, in a state where the mask 20 is arranged in order to form the sealing film layer 17, a space (gap) exists between the organic EL layer 15 (actually, the second electrode 16 the illustration of which is omitted in the drawing) and the mask 20 in the half-open apertures 202.

In a case where the chemical vapor deposition (CVD) method, for example, is used as the film forming method, film forming gas is supplied from above the mask 20, whereby thick films are formed in the portions immediately below the full-open apertures 201, on the surface of the organic EL layer 15 (actually, the second electrode 16 the illustration of which is omitted in the drawing). Further, in the portions immediately below the half-open apertures 202, the film forming gas having flown through the full-open apertures 201 intrudes thereto, films thinner than those in the portions immediately below the full-open apertures 201 are formed. This allows sealing films having different film thicknesses to be continuously formed, thereby allowing the sealing film layer 17 in a shape having protrusions and recesses to be formed. In this case, the sealing film layer 17 has a single layer structure.

The film forming method may be any method as long as sealing films having different film thicknesses can be formed by the method, and is not limited to the CVD method. For example, by the sputtering method, film forming particles intrude in the gap between the second electrode 16 and the mask 20, whereby sealing films having different film thicknesses can be continuously formed in the portions immediately below the full-open apertures 201 and the portions immediately below the half-open apertures 202.

The size and pitch of the protrusions and recesses of the sealing film layer 17 can be freely controlled by changing the opening sizes of the full-open apertures 201 and the half-open apertures 202. Further, the shape of the sealing film layer 17 can be freely controlled by appropriately setting the shape of the mask 20. Examples of the shape of the sealing film layer 17 are illustrated in FIGS. 3 to 5.

Figure 3:
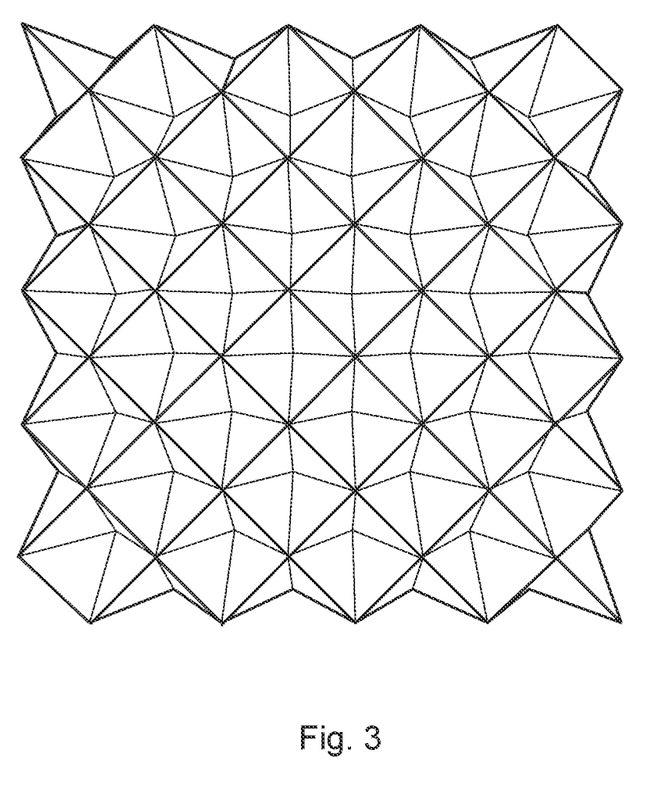
FIG. 3 illustrates a configuration in which protruding portions of the sealing film layer are formed in a lattice pattern (grid pattern).

FIG. 3 illustrates a configuration in which protruding portions of the sealing film layer 17 in a shape having protrusions and recesses are formed in a diagonal lattice pattern (grid pattern). By using a mask 20 in which the full-open apertures 201 are formed in a diagonal lattice pattern, and the half-open apertures 202 are arranged in areas surrounded by the full-open apertures 201 in the diagonal lattice pattern, a sealing film layer 17 in which protruding portions are in a diagonal lattice pattern can be formed. Further, though the illustration is omitted in the drawing, by using a lattice-pattern mask 20 in which the full-open apertures 201 arranged vertically and horizontally thereby perpendicularly intersecting with one another, a sealing film layer 17 in a lattice pattern in which the protruding portions extending vertically and horizontally intersect with one another perpendicularly can be formed.

In the case where the protruding portions of the sealing film layer 17 are formed in a lattice pattern (grid pattern), even if the sealing film layer 17 (organic EL display device 1) is bent in a direction in which the protruding portions extend, stress occurring upon the bending is reduced. It is therefore possible to prevent cracks from being generated in the sealing film layer 17.

Figure 4:
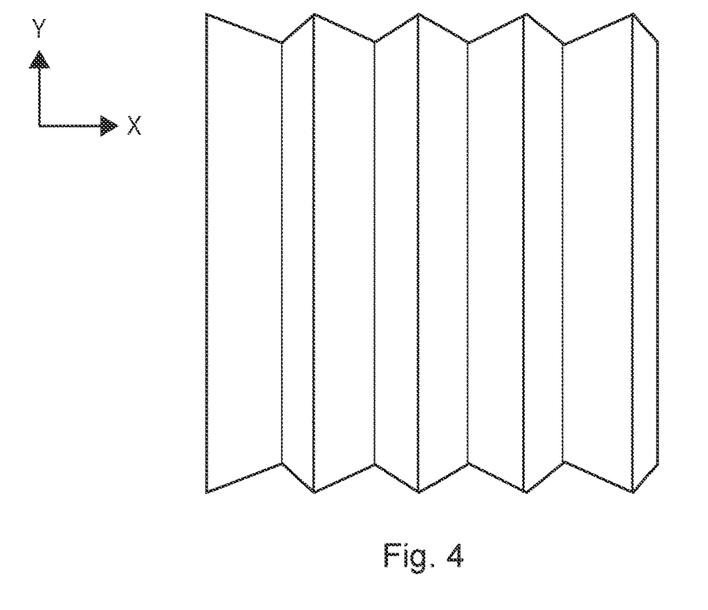
FIG. 4 illustrates a configuration in which the protruding portions of the sealing film layer are continuous in the Y axis direction (direction in which short sides of the panel are directed), and a plurality of the protruding portions continuous in the Y axis direction are arrayed in the X axis direction (direction in which long sides of the panel are directed) at predetermined intervals.
Figure 5:
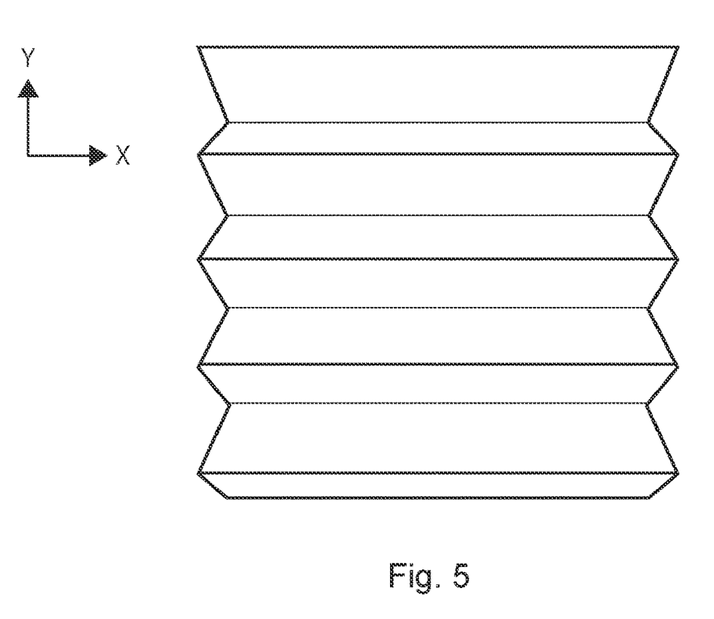
FIG. 5 illustrates a configuration in which protruding portions of the sealing film layer are continuous in the X axis direction (direction in which the long sides of the panel are directed), and a plurality of the protruding portions continuous in the X axis direction are arrayed in the Y axis direction (direction in which the short sides of the panel are directed) at predetermined intervals.

FIG. 4 illustrates a configuration in which protruding portions and recessed portions of the sealing film layer 17 in a shape having protrusions and recesses extend in the Y axis direction (direction in which the short sides of the panel are directed), and the plurality of the protruding portions and the recessed portions extending in the Y axis direction are alternately arrayed in the X axis direction (direction in which the long sides of the panel are directed). Here, the vertical direction on the surface of the drawing sheet is assumed to be the Y axis direction, and the horizontal direction on the surface of the drawing sheet is assumed to be the X axis direction. With this configuration, when the sealing film layer 17 is bent along the Y axis, stress occurring upon the bending is reduced.

In the mask 20 used for forming the sealing film layer 17 illustrated in FIG. 4, the full-open apertures 201 and the half-open apertures 202 extend in the Y axis direction, and the plurality of the full-open apertures 201 and the half-open apertures 202 extending in the Y axis direction are arrayed alternately in the X axis direction.

FIG. 5 illustrates a configuration in which protruding portions and recessed portion of the sealing film layer 17 in a shape having protrusions and recesses extend in the X axis direction (direction in which the long sides of the panel are directed), and a plurality of the protruding portions and the recessed portions extending in the X axis direction are arrayed alternately in the Y axis direction (direction in which the short sides of the panel are directed). With this configuration, when the sealing film layer 17 is bent along the X axis, stress occurring upon the bending is reduced.

In the mask 20 used for forming the sealing film layer 17 illustrated in FIG. 5, the full-open apertures 201 and the half-open apertures 202 extend in the X axis direction, and the plurality of the full-open apertures 201 and the half-open apertures 202 extending in the X axis direction are arrayed alternately in the Y axis direction.

Embodiment 2

In the organic EL display device 1 in Embodiment 1 described above, the sealing film layer 17 has a single layer structure. In an organic EL display device 1 in Embodiment 2, a sealing film layer 17 has a laminate structure of two layers. Among configurations of the organic EL display device 1 in Embodiment 2, the configurations other than that of the sealing film layer 17 are identical to those of the organic EL display device 1 in Embodiment 1. Further, among the methods used for producing the organic EL display device 1 in Embodiment 2, the producing methods other than the method for forming the sealing film layer 17 are identical to those used for the organic EL display device 1 in Embodiment 1.

(Method for Forming Sealing Film Layer)

Figure 6:
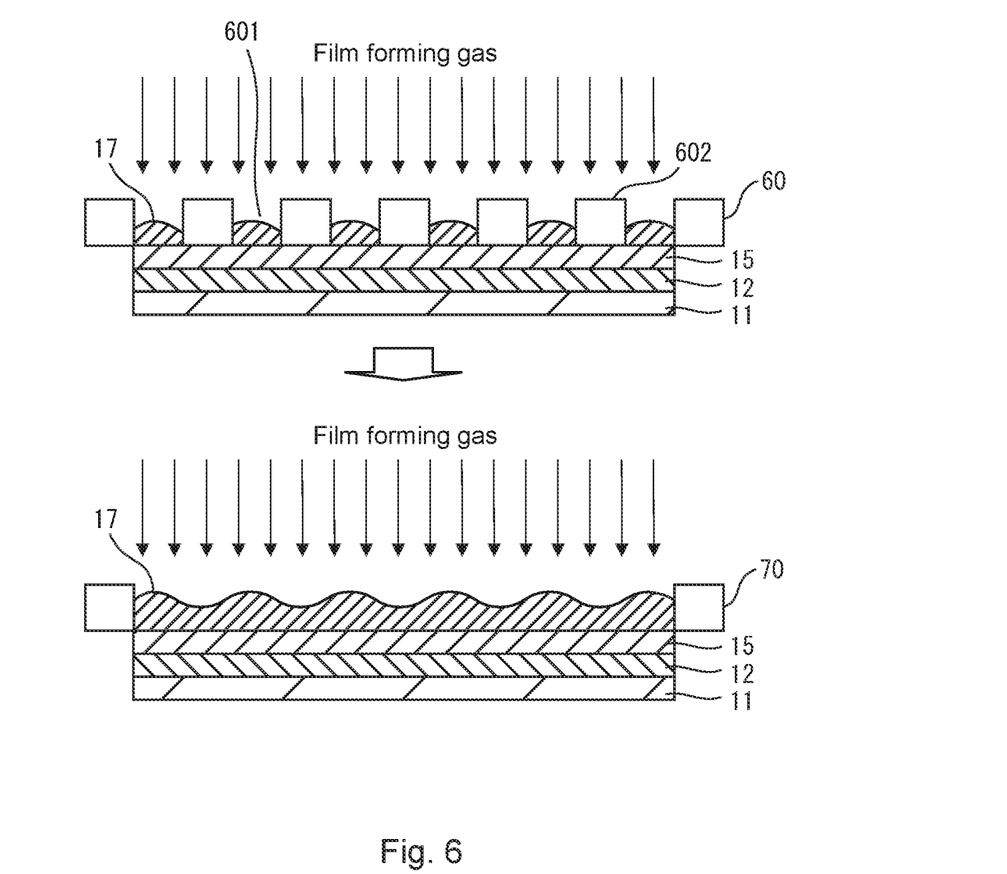
FIG. 6 is a diagram for explaining a method for forming a sealing film layer in an organic EL display device in Embodiment 2.

FIG. 6 is a diagram for explaining a method for forming the sealing film layer 17 in the present embodiment. As will be described later, in Embodiment 2, a sealing film layer 17 having a two-layer structure is formed through two steps, i.e., Steps 1 and 2. The upper diagram (Step 1) of FIG. 6 illustrates a state in which the TFTs 12 and the organic EL layer 15 are arranged on the TFT substrate 11, and further a mask 60 is arranged thereon. Further, the lower diagram (Step 2) of FIG. 6 illustrates a state in which the TFTs 12 and the organic EL layer 15 are arranged on the TFT substrate 11, and further, a mask 70 is arranged thereon. Actually, the first electrodes 13, the second electrode 16, and the like are arranged as well, but the illustration of the same is omitted in FIG. 6.

The mask 60 does not have the half-open apertures 202, which the mask 20 in Embodiment 1 described above have. In other words, in the mask 60, only full-open apertures 601 that completely pass through the mask 60 are provided as openings, and a portion of the mask 60 other than the full-open apertures 601 is a shielding portion 602 in which no opening exists.

The mask 60 has a shape in accordance with the shape of the sealing film layer 17 to be formed. For example, in a case where the sealing film layer 17 having protruding portions in a lattice pattern (grid pattern) as illustrated in FIG. 3 is to be formed, a mask 60 in which the full-open apertures 601 are in a lattice pattern is used. Further, in a case where the sealing film layer 17 in which a plurality of protruding portions and recessed portions extending in the Y axis direction are alternately arrayed in the X axis direction as illustrated in FIG. 4 is to be formed, a mask 60 having the following configuration is used: a plurality of full-open apertures 601 and shielding portions 602 extend in the Y axis direction, and the full-open apertures 601 and the shielding portions 602 thus extending in the Y axis direction are alternately arrayed in the X axis direction. Further, in a case where the sealing film layer 17 in which a plurality of protruding portions and recessed portions extending in the X axis direction are alternately arrayed in the Y axis direction as illustrated in FIG. 5 is to be formed, a mask 60 having the following configuration is used: a plurality of full-open apertures 601 and shielding portions 602 extend in the X axis direction, and the full-open apertures 601 and the shielding portions 602 thus extending in the X axis direction are alternately arrayed in the Y axis direction. Adjacent ones of the full-open apertures 601 have a space therebetween of, for example 1 mm or more.

The following description describes a method for forming the sealing film layer 17. In a case where the chemical vapor deposition (CVD) method, for example, is used as a film forming method, film forming gas is supplied from above the mask 60, whereby films are formed in the portions immediately below the full-open apertures 601, on the surface of the organic EL layer 15 (actually, the second electrode 16 the illustration of which is omitted in the drawing) (Step 1).

Subsequently, a mask 70 having an opening that ranges over an entirety of the film forming area is used and the film forming gas is supplied from above the mask 70, whereby a films is formed over an entirety of the surface area of the organic EL layer 15 (actually, the second electrode 16 the illustration of which is omitted in the drawing) (Step 2). The film formed in this step 2 has a uniform thickness.

Through the above-described film forming process, thicker films are formed through the processing operations in Steps 1 and 2, in the portions immediately below the full-open apertures 601 of the mask 60, on the surface of the second electrode 16, and films thinner than the films in the portions immediately below the full-open apertures 601 of the mask 60 are formed through the processing operation in Step 2, in portions covered by the shielding portions 602. This allows sealing films having different film thicknesses to be formed continuously.

In other words, portions where films are formed in Step 1 become protruding portions, and portions where films are not formed in Step 1 become recessed portions, whereby the sealing film layer 17 in a shape having protrusions and recesses can be formed. In this case, the sealing film layer 17 has a laminate structure of two layers, which are the layer formed in Step 1 and the layer formed in Step 2.

The processing operations in Steps 1 and 2 can be performed in a reverse order. More specifically, the processing operation in Step 2 is performed so that a flat film having a uniform thickness is formed on an entire surface of the second electrode 16, and next, the processing operation in Step 1 is performed so that the protruding portions of the sealing film are formed.

The present invention is not limited to the above-described embodiments. For example, the shape of the sealing film layer 17 is not limited to the shapes illustrated in FIGS. 3 to 5, and the shape may be any shape as long as it has protrusions and recesses and allows stress occurring upon bending to be reduced. Further, in a case where the sealing film layer 17 has a laminate structure, the structure may be a structure of three or more layers.

In the embodiments described above, the configuration in which the sealing film layer 17 is provided immediately above the second electrode 16 is used, but the configuration may be such that another layer is interposed between the second electrode 16 and the sealing film layer 17. In other words, the sealing film layer 17 may be any film as long as the film covers the second electrode 16, and is not necessarily in contact with the second electrode 16.

The organic EL display device 1 in the above-described embodiments can be used in a variety of displays of devices such as a television set, a smartphone, a tablet terminal, and a game machine.

DESCRIPTION OF REFERENCE NUMERALS

1: organic EL display device
11: TFT substrate
13: first electrode
15: organic EL layer
16: second electrode
17: sealing film layer

The invention claimed is:

1. A method for producing an organic electro-luminescence display device, the method comprising the steps of:
   forming a first electrode on a substrate;
   forming an organic electro-luminescence layer on the first electrode;
   forming a second electrode on the organic electro-luminescence layer; and
   forming a sealing film layer having protruding portions and recessed portions that have a finer density than a subpixel pitch so that the sealing film layer covers the second electrode,
   wherein, in the step of forming the sealing film layer having protruding portions and recessed portions, a sealing film layer having a single layer structure is formed by using a mask that has full-open apertures that completely pass through the mask, and half-open apertures at which thickness of the mask is decreased.

2. The method for producing an organic electro-luminescence display device according to claim 1, further comprising
   providing a flexible substrate covering the sealing film layer.

3. The method for producing an organic electro-luminescence display device according to claim 1,
   wherein, in the step of forming the sealing film layer, the sealing film layer is formed by using a mask in which the full-open apertures are arranged in a lattice pattern and the half-open apertures are arranged in areas surrounded by the full-open apertures in the lattice pattern.

4. The method for producing an organic electro-luminescence display device according to claim 3,
   wherein the lattice pattern is a diagonal lattice pattern.

5. The method for producing an organic electro-luminescence display device according to claim 1,
   wherein the sealing film layer is formed in such a shape that the protruding portions and the recessed portions are arrayed alternately by using a mask in which the full-open apertures and the half-open apertures are arranged alternately in one direction.

6. The method for producing an organic electro-luminescence display device according to claim 1,
   wherein, in the step of forming the sealing film layer having protruding portions and recessed portions, the sealing film layer is formed so that a height from a bottom of the recessed portions to a top of the protruding portions is in a range of 100 nm to 5000 nm.

* * * * *